United States Patent
Mun et al.

(10) Patent No.: US 11,715,526 B2
(45) Date of Patent: Aug. 1, 2023

(54) MEMORY DEVICE AND OPERATING METHOD THEREOF

(71) Applicant: SK hynix Inc., Gyeonggi-do (KR)

(72) Inventors: Yeong Jo Mun, Gyeonggi-do (KR); Hyun Seob Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 149 days.

(21) Appl. No.: 17/410,490

(22) Filed: Aug. 24, 2021

(65) Prior Publication Data

US 2022/0319608 A1    Oct. 6, 2022

(30) Foreign Application Priority Data

Apr. 1, 2021    (KR) .................. 10-2021-0042452

(51) Int. Cl.
*G11C 16/28*    (2006.01)
*G11C 16/14*    (2006.01)
*G11C 16/08*    (2006.01)
*G11C 16/04*    (2006.01)

(52) U.S. Cl.
CPC .............. *G11C 16/14* (2013.01); *G11C 16/08* (2013.01); *G11C 16/0483* (2013.01)

(58) Field of Classification Search
CPC .................................................... G11C 16/28
See application file for complete search history.

(56) References Cited

U.S. PATENT DOCUMENTS

2020/0013795 A1*   1/2020   Dunga ................... G11C 16/10

FOREIGN PATENT DOCUMENTS

| KR | 101811035 B1 | 12/2017 |
| KR | 1020180135576 A | 12/2018 |
| KR | 1020200115800 A | 10/2020 |

* cited by examiner

*Primary Examiner* — Jason Lappas
(74) *Attorney, Agent, or Firm* — IP & T Group LLP

(57) ABSTRACT

A memory device including: a memory block including a word lines, word lines located in the middle of the word lines are used as dummy word lines, a control circuit establish word lines stacked on one side and other side of the dummy word lines into a first and second sub-blocks, respectively, performs an independent erase operation on one of the first and second sub-blocks in an erase operation period, and a control logic differently sets a level of a first transfer voltage for controlling transfer of an erase common voltage to the selected sub-block and the level of a second transfer voltage for controlling transfer of the erase common voltage to the unselected sub-block, applies an erase allowable voltage from the erase common voltage to a word line of the selected sub-block, and floats a word line of the unselected sub-block, in the erase operation period.

19 Claims, 8 Drawing Sheets

MEMORY DEVICE AND OPERATING METHOD THEREOF

CROSS-REFERENCE TO RELATED APPLICATION

This application claims priority under 35 U.S.C. § 119 to Korean Patent Application No. 10-2021-0042452 filed on Apr. 1, 2021, which is incorporated herein by reference in its entirety.

BACKGROUND

1. Field

Various embodiments of the present invention relate to a semiconductor design technology, and more particularly, to a memory device capable of performing an erase operation on a sub-block basis, and an operating method thereof.

2. Discussion of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

SUMMARY

Various embodiments of the present invention are directed to a memory device which can perform an erase operation on a sub-block basis, thereby improving the memory efficiency and enhancing the reliability of the erase operation, and an operating method thereof.

The technical problems of the present disclosure are not limited to those mentioned above, and other technical problems which are not mentioned can be clearly understood by the person skilled in the art to which the present disclosure pertains from the following descriptions.

In accordance with an embodiment of the present invention, a memory device may include: a memory device comprising: a memory block including a plurality of memory cells stacked in a direction crossing a substrate, and a plurality of word lines arranged between two or more source select lines and two or more drain select lines, wherein two or more word lines located in the middle of the plurality of word lines are used as dummy word lines; a control circuit suitable for: establishing word lines, stacked on one side of the dummy word lines among the plurality of word lines into a first sub-block, establishing word lines, stacked on the other side of the dummy word lines into a second sub-block, selecting one of the first and second sub-blocks in an erase operation period in which an erase voltage is applied to the substrate, and performing the independent erase operation only on the selected sub-block; and a control logic suitable for controlling the control circuit to differently set a level of a first transfer voltage for controlling transfer of an erase common voltage to the selected sub-block and a level of a second transfer voltage for controlling transfer of the erase common voltage to the unselected sub-block, to apply the erase common voltage as an erase allowable voltage to a word line of the selected sub-block, and to float a word line of the unselected sub-block, in the erase operation period.

In accordance with an embodiment of the present invention, a memory device may include: a memory device comprising: a memory block including a plurality of memory cells stacked in a direction crossing a substrate, and a plurality of word lines arranged between two or more source select lines and two or more drain select lines, wherein two or more word lines located in the middle of the plurality of word lines are used as dummy word lines; and a control circuit suitable for: establishing word lines, stacked on one side of the dummy word lines among the plurality of word lines into a first sub-block, establishing word lines, stacked on the other side of the dummy word lines into a second sub-block, selecting one of the first and second sub-blocks in an erase operation period in which an erase voltage is applied to the substrate, and performing the independent erase operation only on the selected sub-block, wherein in the erase operation period, the control circuit is further suitable for: differently setting a level of a first transfer voltage for controlling transfer of an erase common voltage to the selected sub-block and a level of a second transfer voltage for controlling transfer of the erase common voltage to the unselected sub-block, applying the erase common voltage as an erase allowable voltage to a word line of the selected sub-block and floating a word line of the unselected sub-block.

In accordance with an embodiment of the present invention, an operating method of a memory device which includes a memory block including a plurality of memory cells stacked in a direction crossing a substrate and a plurality of word lines arranged between two or more source select lines and two or more drain select lines, wherein two or more word lines located in the middle of the plurality of word lines are used as dummy word lines, whereinword lines stacked on one side of the dummy word lines among the plurality of word lines are established into a first sub-block, and word lines stacked on the other side of the dummy word lines are established into a second sub-block, the operating method may include: an erase operation which includes selecting one of the first and second sub-blocks and then performing the independent erase operation only on the selected sub-block, in an erase operation period in which an erase voltage is applied to the substrate; and a transfer operation which includes: differently setting a level of a first transfer voltage for controlling transfer of an erase common voltage to the sub-block selected between the first and second sub-blocks and a level of a second transfer voltage for controlling transfer of the erase common voltage to the unselected sub-block, applying the erase common voltage as an erase allowable voltage to a word line of the selected sub-block, and floating a word line of the unselected sub-block, in the erase operation period.

In accordance with an embodiment of the present invention, a memory device may include: a memory block including stacked memory cells respectively coupled to local lines arranged in a direction of the stack; and a control circuit suitable for performing an erase operation on a first sub-block by transferring an erase allowable voltage to word lines coupled to the first sub-block while blocking transfer of the erase allowable voltage to word lines coupled to a second sub-block, wherein the local lines include first and second groups of select lines and a third group of the word lines arranged between the first and second groups, wherein the memory block is divided into the first and second sub-blocks with respect to a cluster of dummy word lines within the third group, and wherein the erase operation is a Gate Induced Drain Leakage (GIDL)-based erase operation.

The control circuit may be further suitable for floating the individual first and second groups at the same timing or at different timings.

The control circuit may float each of the first and second groups sequentially from an outermost line to an innermost line therewithin.

The control circuit may be further suitable for applying an erase prevention voltage of different levels to the individual dummy word lines, and wherein the level of the erase prevention voltage may become greater as the dummy word line among the cluster is arranged closer to the second sub-group.

In accordance with embodiments of the present invention, the memory device capable of performing an erase operation on a sub-block basis may receive one voltage and drive internal word lines in response to different transfer voltages for the respective sub-blocks.

Furthermore, two or more dummy word lines may be disposed between a sub-block selected as an erase target and a sub-block which is not selected as the erase target, and driven to erase prevention voltages having different levels, respectively.

Furthermore, two or more drain select lines or source select lines may be sequentially floated according to a predetermined order within a preset time from a time point later than the time point that the erase voltage is applied to the substrate during the erase operation period.

Through this technology, the memory efficiency may be improved, and the reliability of the erase operation may be enhanced.

DETAILED DESCRIPTION

Figure 1:
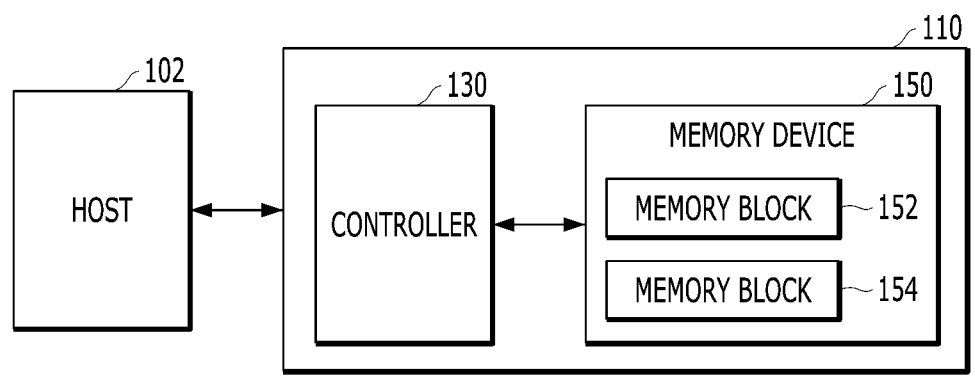
FIG. 1 is a diagram for describing an example of a memory system in accordance with an embodiment of the present invention.

Various examples of the present disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete, and fully conveys the disclosure to those skilled in the art to which the invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may be exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to limit the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the present disclosure are described in detail below with reference to the accompanying drawings, wherein like numbers reference like elements.

FIG. 1 is a diagram for describing an example of a memory system in accordance with an embodiment of the present invention.

Referring to FIG. 1, the data processing system 100 may include a host 102 engaged or operably coupled with the memory system 110.

The host 102 may include any portable electronic device, such as a mobile phone, an MP3 player, a laptop computer, or the like, and any electronic device, such as a desktop computer, a game player, a television (TV), a projector, or the like.

The host 102 also includes at least one operating system (OS), which can generally manage and control, functions and operations performed in the host 102. The OS can provide interoperability between the host 102 engaged with the memory system 110 and the user using the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix, and the like. Further, the mobile operating system may include Android, iOS, Windows mobile, and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), and a flash memory.

The memory system 110 may include a controller 130 and a memory device 150. The memory device 150 may store data to be accessed by the host 102. The controller 130 may control an operation of storing data in the memory device 150.

The controller 130 and the memory device 150 included in the memory system 110 may be integrated into a single semiconductor device, which may be included in any of the various types of memory systems as discussed above in the examples.

By way of example but not limitation, the controller 130 and memory device 150 may be implemented with an SSD.

When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (SM, SMC), a memory stick, a multimedia card (MMC, RS-MMC, MMCmicro), a SD card (SD, miniSD, microSD, SDHC), a universal flash memory, or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

Figure 2:
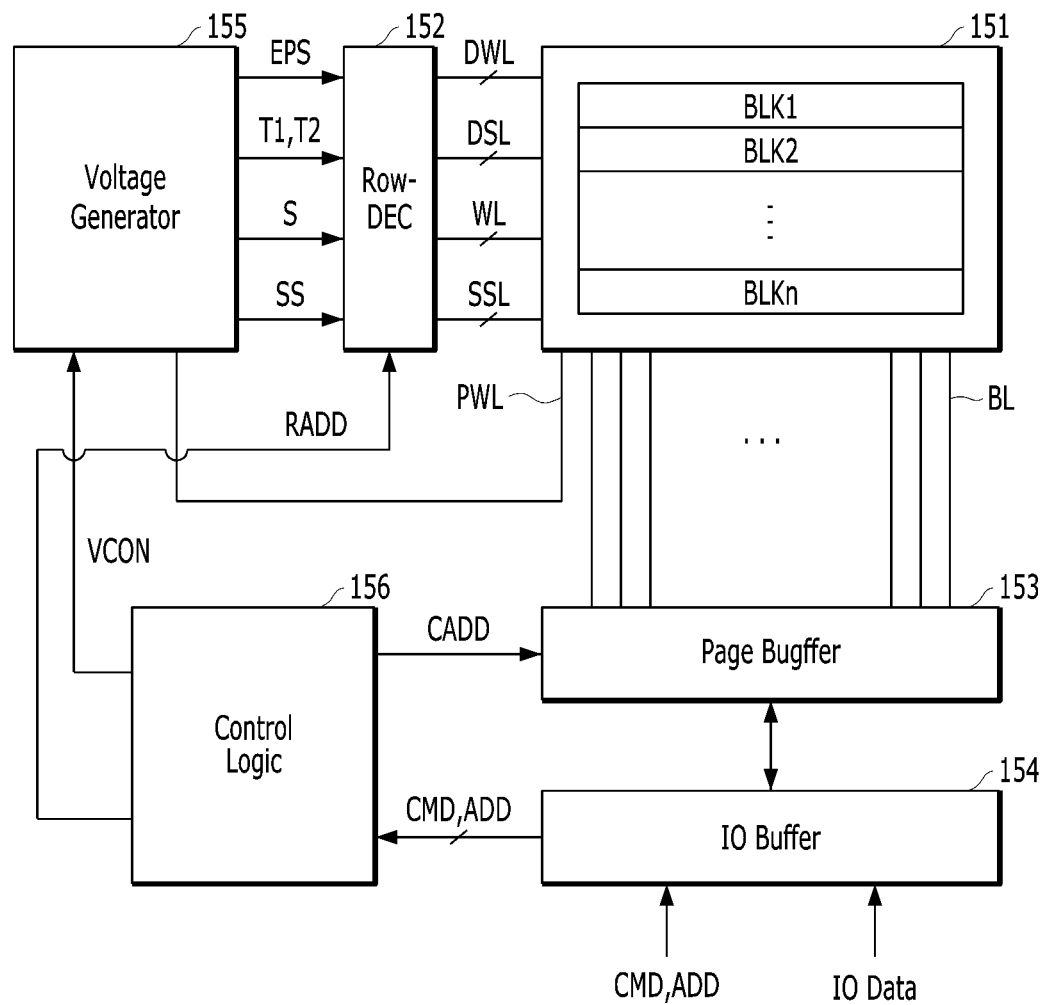
FIG. 2 is a diagram for describing an example of a memory device illustrated in FIG. 1 in accordance with an embodiment of the present invention.

FIG. 2 is a diagram for describing an example of the memory device illustrated in FIG. 1 in accordance with an embodiment of the present invention.

Referring to FIG. 2, the memory device 150 in accordance with an embodiment may include a memory cell array 151 in which data are stored. The memory device 150 may include peripheral circuits 152 to 155 configured to perform a program operation for storing data in the memory cell array 151, a read operation for outputting the stored data, and an erase operation for easing the stored data. The memory device 150 may include a control logic 156 configured to control the peripheral circuits 152 to 155 under control of the memory controller (130 of FIG. 1). The peripheral circuits 152 to 155 may include a row decoder 152, a page buffer 153, an I/O buffer 154 and a voltage generator 155.

The memory cell array 151 may include a plurality of memory blocks BLK1 to BLKn where n is a positive integer. Local lines LL and bit lines BL may be coupled to the memory blocks BLK1 to BLKn. For example, the local lines LL may include two or more source select lines SSL, two or more drain select lines DSL, and a plurality of word lines WL arranged between the source select lines SSL and the drain select lines DSL. The local lines LL may further include two or more dummy lines DWL arranged between the word lines WL. Furthermore, the local lines LL may include a substrate bias line PWL. The local lines LL may be coupled to the memory blocks BLK1 to BLKn, and the bit lines BL may be coupled to the memory blocks BLK1 to BLKn in common. The memory blocks BLK1 to BLKn may be implemented as a 2D or 3D structure. For example, in the memory blocks BLK1 to BLKn with a 2D structure, memory cells may be arranged in a direction parallel to a substrate. For example, in the memory blocks BLK1 to BLKn with a 3D structure, memory cells may be stacked in a direction crossing a substrate.

The row decoder 152 may be electrically coupled to the memory cell array 151 through the word lines WL, the select lines DSL and SSL and the dummy lines DWL. The page buffer 153 may be electrically coupled to the memory cell array 151 through the bit line BL. The voltage generator 155 may be electrically coupled to the memory cell array 151 through the substrate bias line PWL.

Each of the memory blocks BLK1 to BLKn may include two or more sub-blocks. Each of the sub-blocks may correspond to an erase unit. Each of the two or more sub-blocks may include a plurality of cell strings. Each of the cell strings may include a plurality of memory cells stacked in a direction crossing the substrate.

The row decoder 152 may be configured to operate in response to control of the control logic 156. The row decoder 152 may receive a row address RADD from the control logic 156. The row decoder 152 may be configured to decode the received row address RADD. The row decoder 152 may select any of the memory blocks BLK1 to BLKn included in the memory cell array 151 in response to the decoded row address RADD. The row decoder 152 may transfer operating voltages S, SS, EPS, T1 and T2 from the voltage generator 155 to the word line WL, the select lines DSL and SSL and the dummy line DWL of the selected memory block. For example, the operating voltages S, SS, EPS, T1 and T2 may include an erase prevention voltage EPS, an erase common voltage S, a first transfer voltage T1, a second transfer voltage T2 and a selection voltage SS.

The page buffer 153 may operate as a write driver or sense amplifier depending on an operation mode. During a program operation, the page buffer 153 may transfer a voltage, corresponding to data to be programmed, to a bit line BL of the memory cell array 151. During a read operation, the page buffer 153 may sense data stored in a selected memory cell through the bit line BL, and transfer the sensed data to the I/O buffer 154. In an erase operation period, the page buffer 153 may float the bit line BL of the memory cell array 151.

During a program operation, the I/O buffer 154 may transfer write data, inputted from the outside, to the page buffer 153. During a read operation, the I/O buffer 154 may output data, provided from the page buffer 153, to the outside. The I/O buffer 154 may transfer an address ADD or command CMD, inputted from the outside, to the control logic 156.

The voltage generator 155 may be coupled to the row decoder 152 and the control logic 156. The voltage generator 155 may be configured to generate various voltages required for program, read and erase operations in response to a voltage control signal VCON of the control logic 156. The voltages generated by the voltage generator 155 may be transferred to the plurality of lines DWL, DSL, WL and SSL, coupled to the memory cell array 151, through the row decoder 152.

The voltage generator 155 may be coupled to the substrate of the memory cell array 151. The substrate may be coupled to the voltage generator 155 through the substrate bias line PWL. The erase voltage generated by the voltage generator 155 may be transferred to the substrate of the memory cell array 151.

The control logic 156 may be coupled to the row decoder 152, the page buffer 153, the I/O buffer 154 and the voltage generator 155. The control logic 156 may output the voltage control signal VCON to generate a voltage required for an operation of the memory device 150, in response to the command CMD inputted through the I/O buffer 154. The control logic 156 may output a row address signal RADD and a column address signal CADD in response to the address signal ADD inputted through the I/O buffer 154.

In an erase operation period, the control logic 156 may control the voltage generator 155 to transfer an erase voltage, generated by the voltage generator 155, to the substrate of a memory block selected among the plurality of memory blocks BLK1 to BLKn included in the memory cell array 151.

The control logic 156 may control the voltage generator 155 and the row decoder 152 to supply an erase common voltage S to the selected memory block in the erase operation period. The control logic 156 may control the voltage generator 155 and the row decoder 152 to apply the first transfer voltage T1 for controlling the transfer of the erase common voltage S to a word line of a sub-block which is selected as an erase target among the two or more sub blocks included in the selected memory block, in the erase operation period. The control logic 156 may control the voltage generator 155 and the row decoder 152 to apply the second transfer voltage T2 for controlling the transfer of the erase common voltage S to a sub-block which is not selected as the erase target among the two or more sub blocks included in the selected memory block, in the erase operation period. Through this operation, the control logic 156 may control the row decoder 152 to transfer the erase common voltage S as an erase allowable voltage to the word line of the sub-block selected as the erase target in the erase operation period. Furthermore, the control logic 156 may control the row decoder 152 to float the word line of the sub block which is not selected as the erase target, in the erase operation period.

The control logic 156 may float the source select line SSL and the drain select line DSL of the selected memory block in the erase operation period. In the erase operation period, the control logic 156 may apply the selection voltage SS to the source select line SSL and float the drain select line DSL at a first time point that an erase voltage starts to be applied to the substrate of the selected memory block, and then float the source select line SSL within a preset time from a second time point later than the first time point. In another embodiment, in the erase operation period, the control logic 156 may apply the selection voltage SS to the drain select line DSL and float the source select line SSL at the first time point when the erase voltage starts to be applied to the substrate of the selected memory block, and then float the drain select line DSL within the preset time from the second time point later than the first time point. In another embodiment, in the erase operation period, the control logic 156 may apply the selection voltage SS to each of the source select line SSL and the drain select line DSL at the first time point that the erase voltage starts to be applied to the substrate of the selected memory block, and then float the source select line SSL and the drain select line DSL within the preset time from the second time point later than the first time point. At this time, the control logic 156 may sequentially float the two or more source select lines SSL from the source select line closer to substrate to the source select line farther from the substrate. Furthermore, the control logic 156 may sequentially float the two or more drain select lines DSL from the drain select line farther from the substrate to the drain select line closer to the substrate.

The control logic 156 may control the voltage generator 155 to apply the erase prevention voltage EPS to the dummy lines DWL in the erase operation period. In particular, the control logic 156 may control the voltage generator 155 to apply the erase prevention voltages EPS having different levels to two or more dummy lines DWL in the erase operation period.

In order to improve the degree of integration of the memory device 150, the number of cell strings included in each of the memory blocks BLK1 to BLKn needs to be increased. To improve the efficiency of the memory device 150, it is necessary to reduce the time required for rewriting data after erasing data stored in each of the memory blocks BLK1 to BLKn. However, when the number of cell strings included in each of the memory blocks BLK1 to BLKn is increased, a lot of time is required during an erase operation period by an existing scheme that performs an erase operation on a memory block basis, thereby degrading the memory efficiency.

In the present embodiment, each of the memory blocks BLK1 to BLKn may be divided into two or more sub blocks, such that the erase operation is performed on a sub block basis. The scheme for performing an erase operation on a sub block basis refers to a scheme for erasing a portion of the capacity of a memory block. The scheme can rapidly and efficiently erase small-volume data, thereby improving the memory efficiency.

Figure 3:
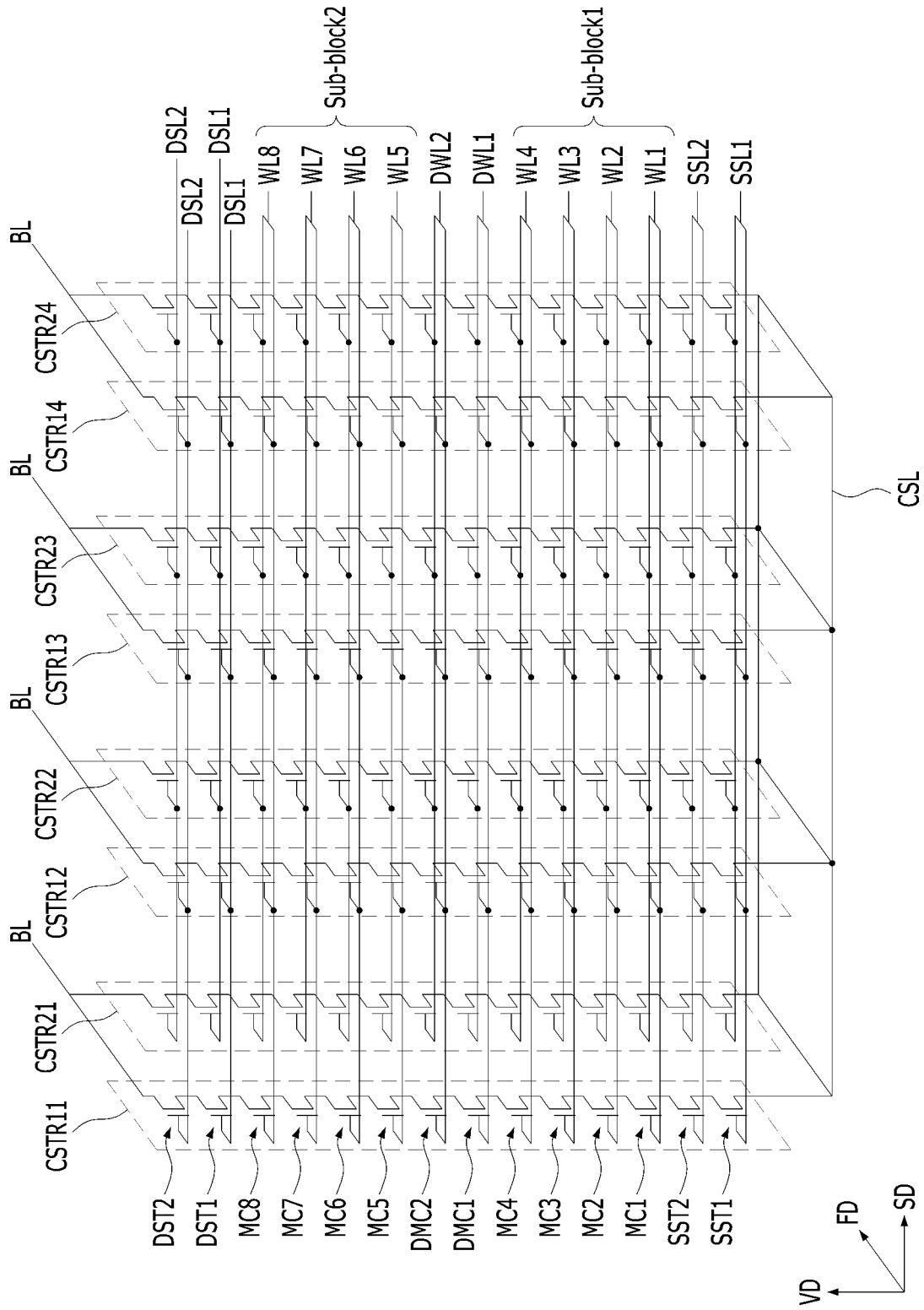
FIG. 3 is a diagram for describing an example of a memory block illustrated in FIG. 2 in accordance with an embodiment of the present invention.

FIG. 3 is a diagram for describing an example of a memory block illustrated in FIG. 2 in accordance with an embodiment of the present invention.

Referring to FIG. 3, a memory block BLKi may include a plurality of cell strings CSTR11 to CSTR14 and CSTR21 to CSTR24 coupled between a plurality of bit lines BL and a common source line CSL. The strings CSTR11 to CSTR14 and CSTR21 to CSTR24 may be configured in the same manner.

Each of the strings CSTR11 to CSTR 14 and CSTR21 to CSTR24 may be coupled between the corresponding bit line BL and the common source line CSL.

Each of the strings CSTR11 to CSTR14 and CSTR21 to CSTR24 may include a plurality of drain select transistors DST<1:2>, a plurality of memory cells MC<1:8>, a plurality of dummy memory cells DMC<1:2> and a plurality of source select transistors SST<1:2>, which are coupled in series between the corresponding bit line BL and the common source line CSL. The memory cells MC<1:8> indicate memory cells which are used for storing valid data, and the dummy memory cells DMC<1:2> indicate memory cells which are not used for storing valid data.

The source select transistors SST<1:2>, the memory cells MC<1:8>, the dummy memory cells DMC<1:2> and the drain select transistors DST<1:2> may be sequentially arranged in a height direction VD. At this time, the dummy memory cells DMC<1:2> may be located in the middle of the memory cells MC<1:8>. For example, as illustrated in FIG. 3, the dummy memory cells DMC<1:2> may be arranged between the first to fourth memory cells MC<1:4> and the fifth to eighth memory cells MC<5:8>.

The gates of the source select transistors SST<1:2> may be coupled to the corresponding source select lines SSL<1: 2>. The gates of the memory cells MC<1:8> may be coupled to the corresponding word lines WL<1:8>. The gates of the dummy memory cells DMC<1:2> may be coupled to the corresponding dummy word lines WL<1:2>. The gates of the drain select transistors DST<1:2> may be coupled to the corresponding drain select lines DSL<1:2>.

The common source line CSL may be formed in a substrate (not illustrated). The substrate may have a main surface extended in first and second directions FD and SD. The common source line CSL may be extended in the second direction SD. The first and second directions FD and SD may cross each other at right angles.

The bit lines BL may be extended in the first direction FD, and arranged in the second direction SD. The source select lines SSL<1:2>, the word lines WL<1:8>, the dummy word lines DWL<1:2> and the drain select lines DSL<1:2> may be extended in the second direction SD.

The cell strings CSTR11 to CSTR14 and CSTR21 to CSTR24 may be extended in the height direction VD perpendicular to the main surface of the substrate, and arranged in the first and second directions FD and SD. In each of the cell strings CSTR11 to CSTR14 and CSTR21 to CSTR24, the memory cell MC<1> which is the closest to the source select transistors SST<1:2> may be located at the smallest height, and the memory cell MC<8> which is the closest to the drain select transistors DST<1:2> may be located at the largest height.

For example, FIG. 3 illustrates that each of the cell strings CSTR11 to CSTR14 and CSTR21 to CSTR24 includes two drain select transistors DST<1:2> and two source select transistors SST<1:2>. However, each of the cell strings CSTR11 to CSTR14 and CSTR21 to CSTR24 may include two or more drain select transistors or two or more source select transistors.

For example, FIG. 3 illustrates that each of the cell strings CSTR11 to CSTR14 and CSTR21 to CSTR24 includes eight main memory cells MC<1:8>. However, each of the cell strings CSTR11 to CSTR14 and CSTR21 to CSTR24 may include two or more memory cells.

For example, FIG. 3 illustrates that each of the cell strings CSTR11 to CSTR14 and CSTR21 to CSTR24 includes two dummy memory cells DMC<1:2> between the four main memory cells MC<1:4> and the other four main memory cells MC<5:8>. However, each of the cell strings CSTR11 to CSTR14 and CSTR21 to CSTR24 may include two or more dummy memory cells.

The memory block BLKi may include a first sub-block Sub-block1 and a second sub-block Sub-block2. The first sub-block Sub-block1 may include first to fourth word lines WL<1:4>, and the second sub-block Sub-block2 may include fifth to eighth word lines WL<5:8>. At this time, the first and second sub-blocks Sub-block1 and Sub-block2 may be disposed in the height direction VD. That is, the first to fourth word lines WL<1:4> stacked on one side of the two dummy word lines DWL<1:2> may be established into the first sub-block Sub-block1, and the fifth to eighth word lines WL<5:8> stacked on the other side thereof may be established into the second sub-block Sub-block2.

The first and second sub-blocks Sub-block1 and Sub-block2 may be erased independently of each other. That is, any sub-block of the first and second sub-blocks Sub-block1 and Sub-block2 may be selected so that an erase operation is performed only on the selected sub-block and not performed on the unselected sub-block. At this time, the erase prevention voltages may be applied to the two dummy word lines DWL<1:2> located between the first to fourth word lines WL<1:4> and the fifth to eighth word lines WL<5:8>, in order to independently erase the first and second sub-blocks Sub-block1 and Sub-block2. The erase prevention voltages applied to the two dummy word lines DWL<1:2> may have different levels.

So far, the method for establishing the sub-blocks defined in one memory block BLKi has been described as an example. However, the criteria for establishing the sub-blocks are not limited to the illustrated example. That is, FIG. 3 illustrates an example in which one physical block BLKi includes two sub-blocks Sub-block1 and Sub-block2.

However, one physical block BLKi may include three or more sub-blocks. Furthermore, FIG. 3 illustrates an example in which one sub-block Sub-block1 or Sub-block2 includes four word lines. However, it may be understood that one sub-block Sub-block1 or Sub-block2 may include three or less word lines or five or more word lines. Furthermore, FIG. 3 illustrates an example in which two dummy word lines DWL<1:2> are included in order to establish the two sub-blocks Sub-block1 and Sub-block2. However, it may be understood that one dummy word line or three or more dummy word lines may be included.

Figure 4:
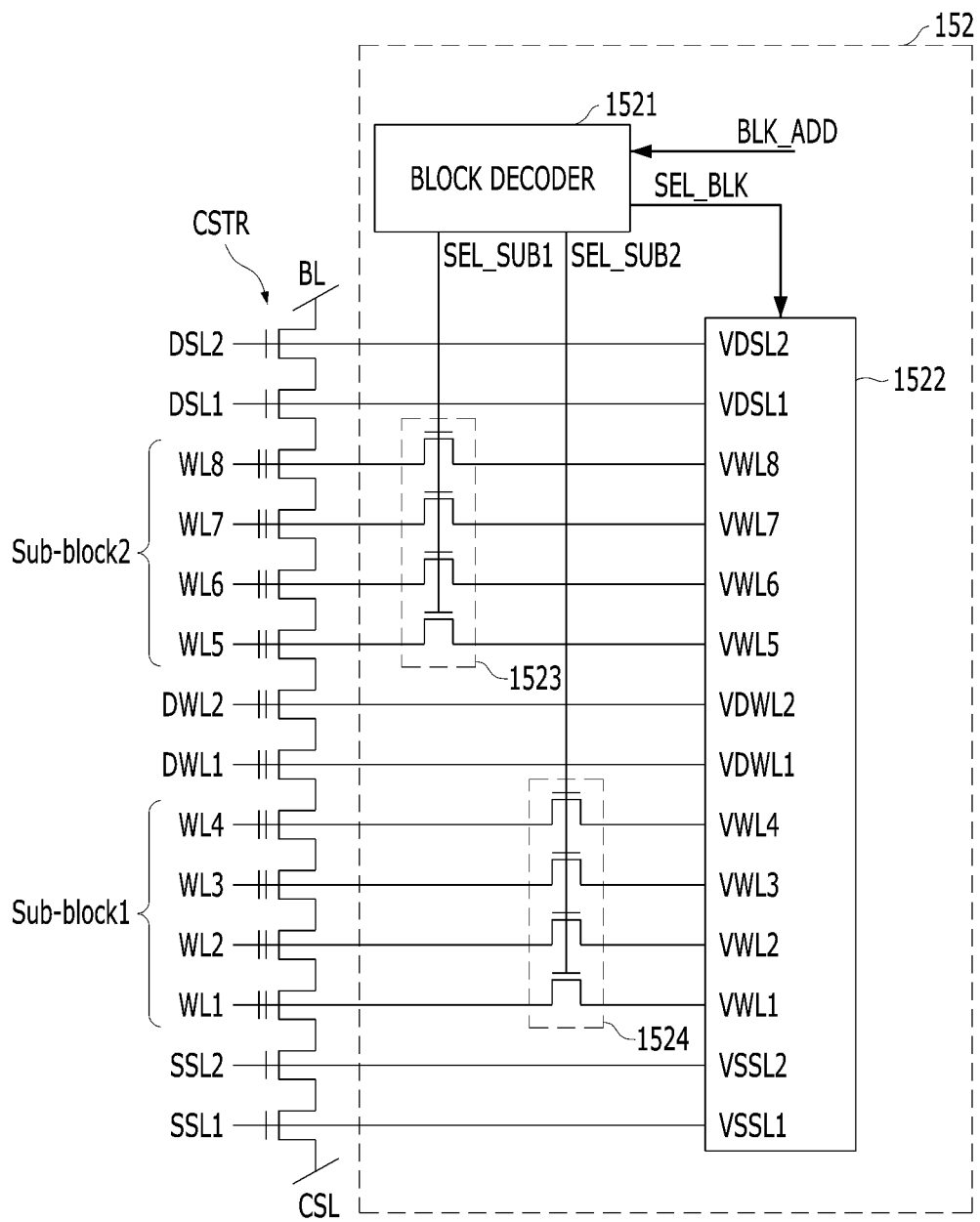
FIG. 4 is a diagram for describing an example of an erase operation performed by the memory device in accordance with an embodiment of the present invention.
Figure 5:
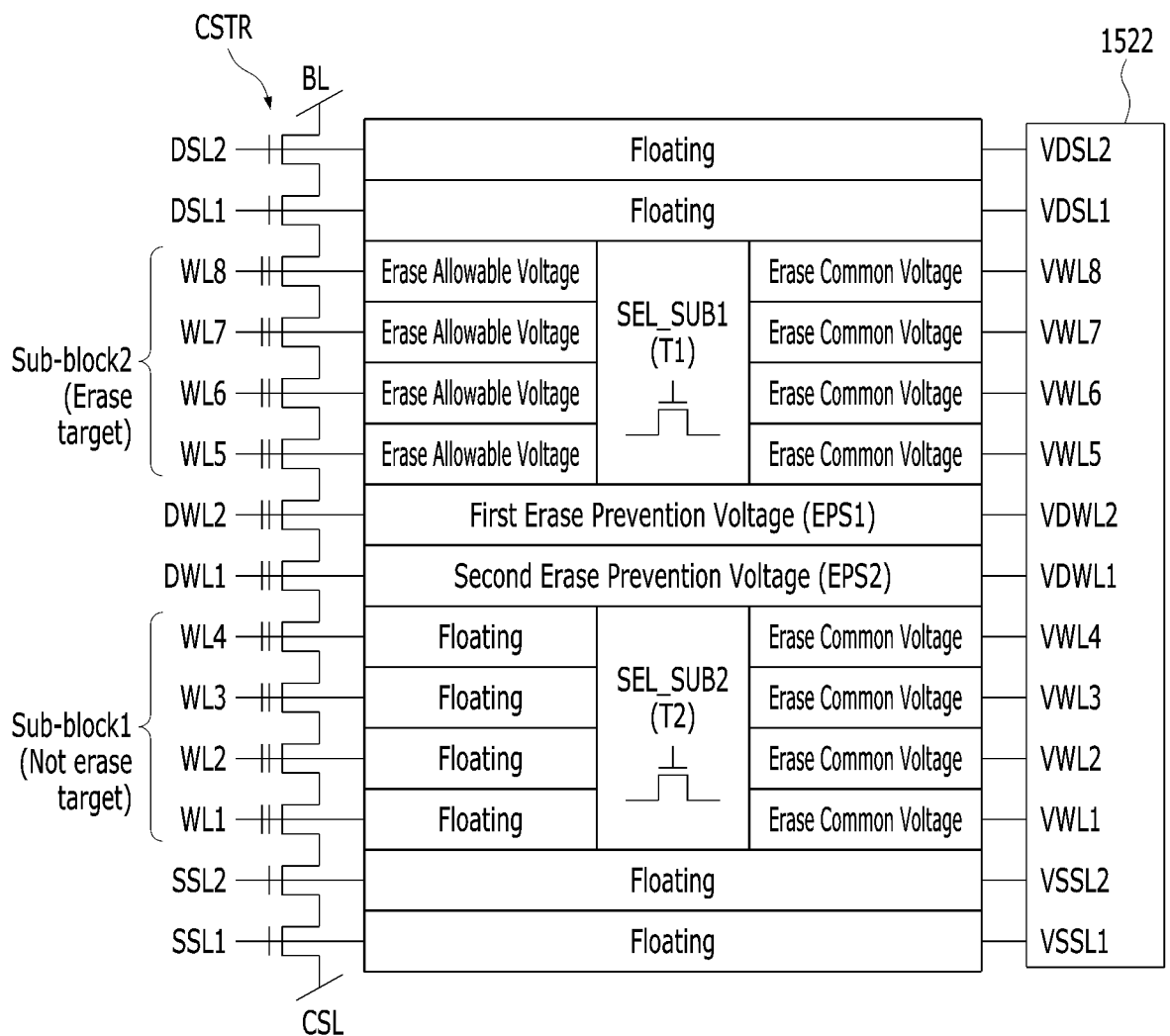
FIGS. 5 to 8 are diagrams for describing an erase operation method of the memory device in accordance with an embodiment of the present invention.
Figure 6:
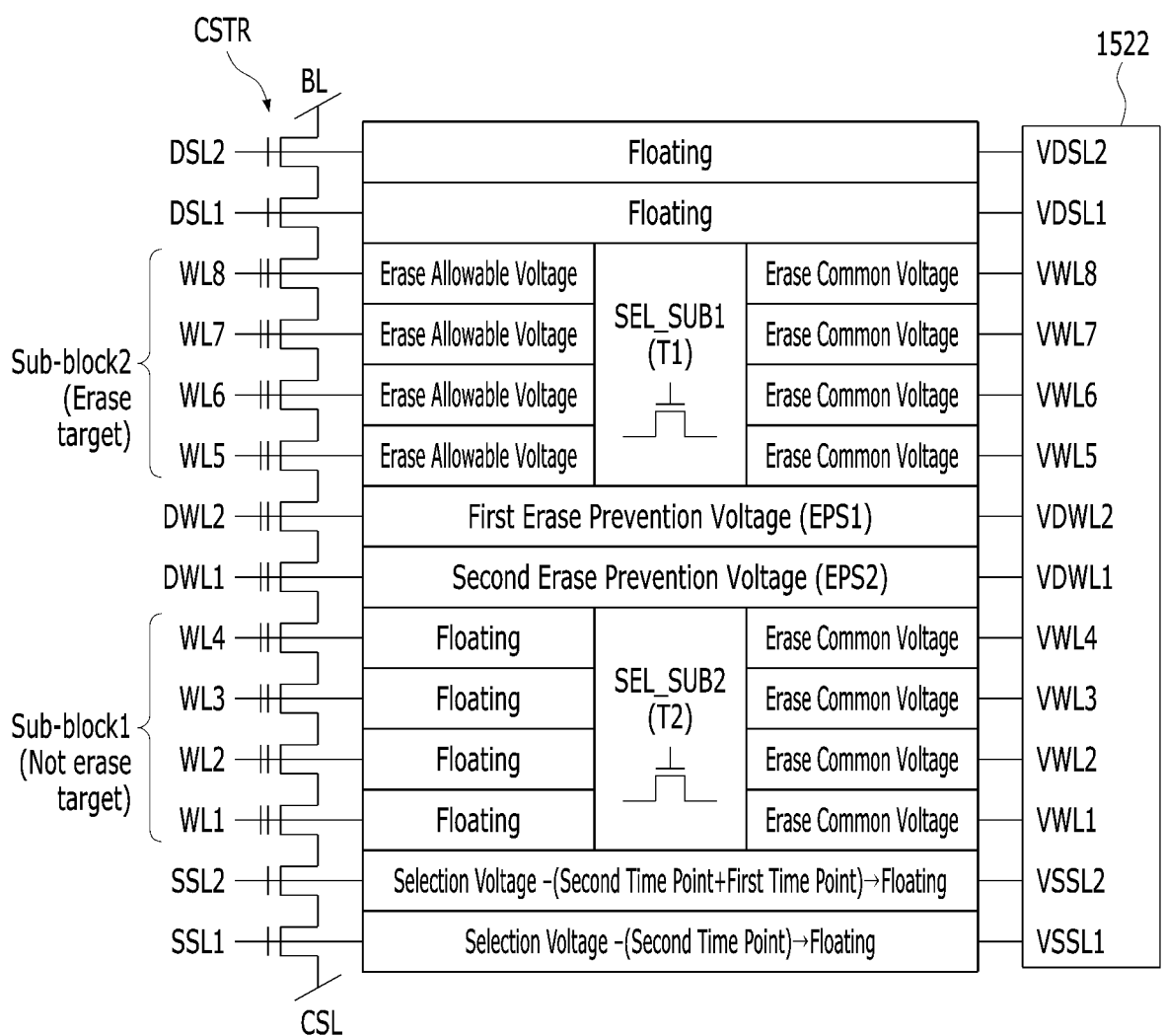
Figure 7:
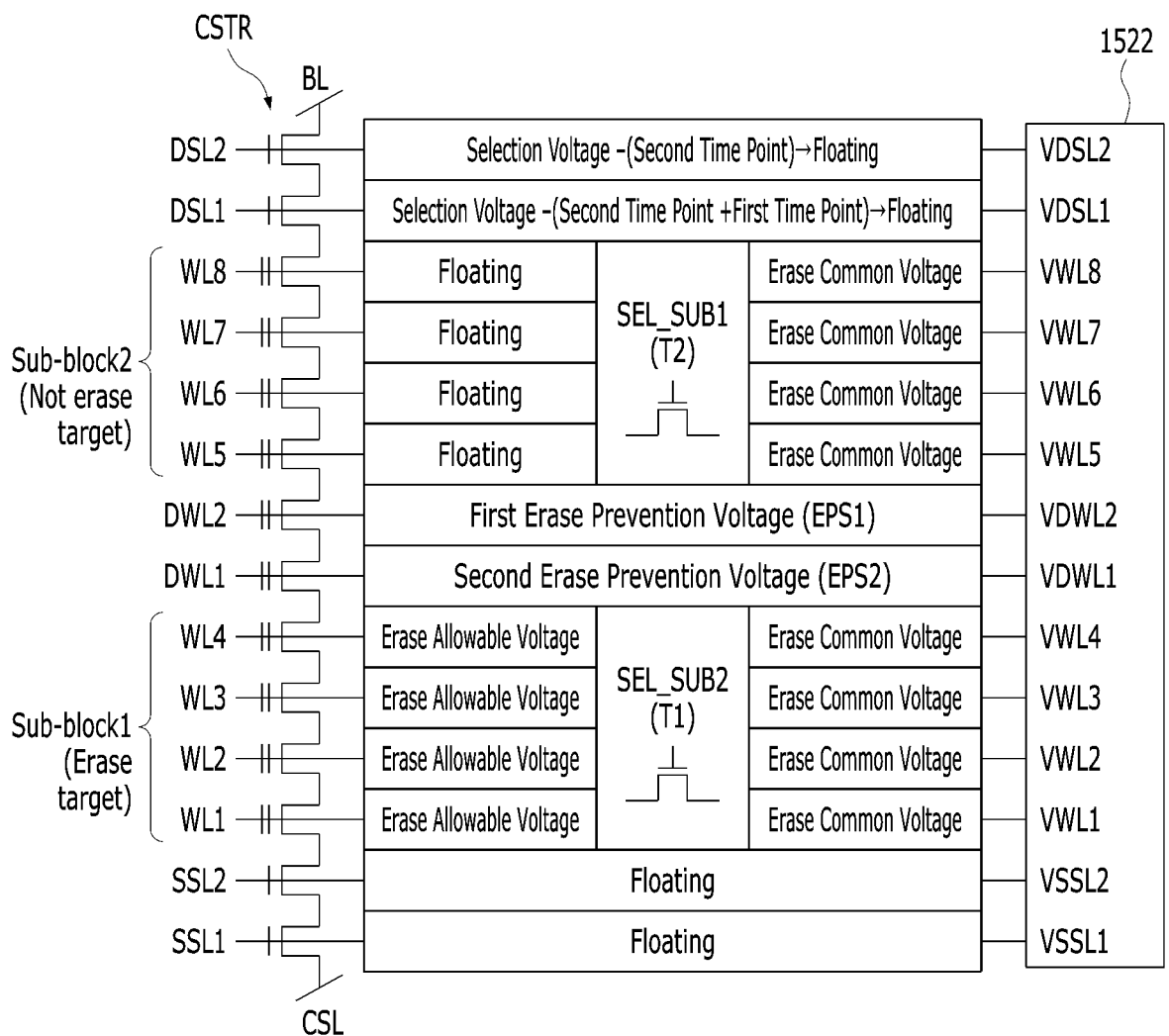
Figure 8:
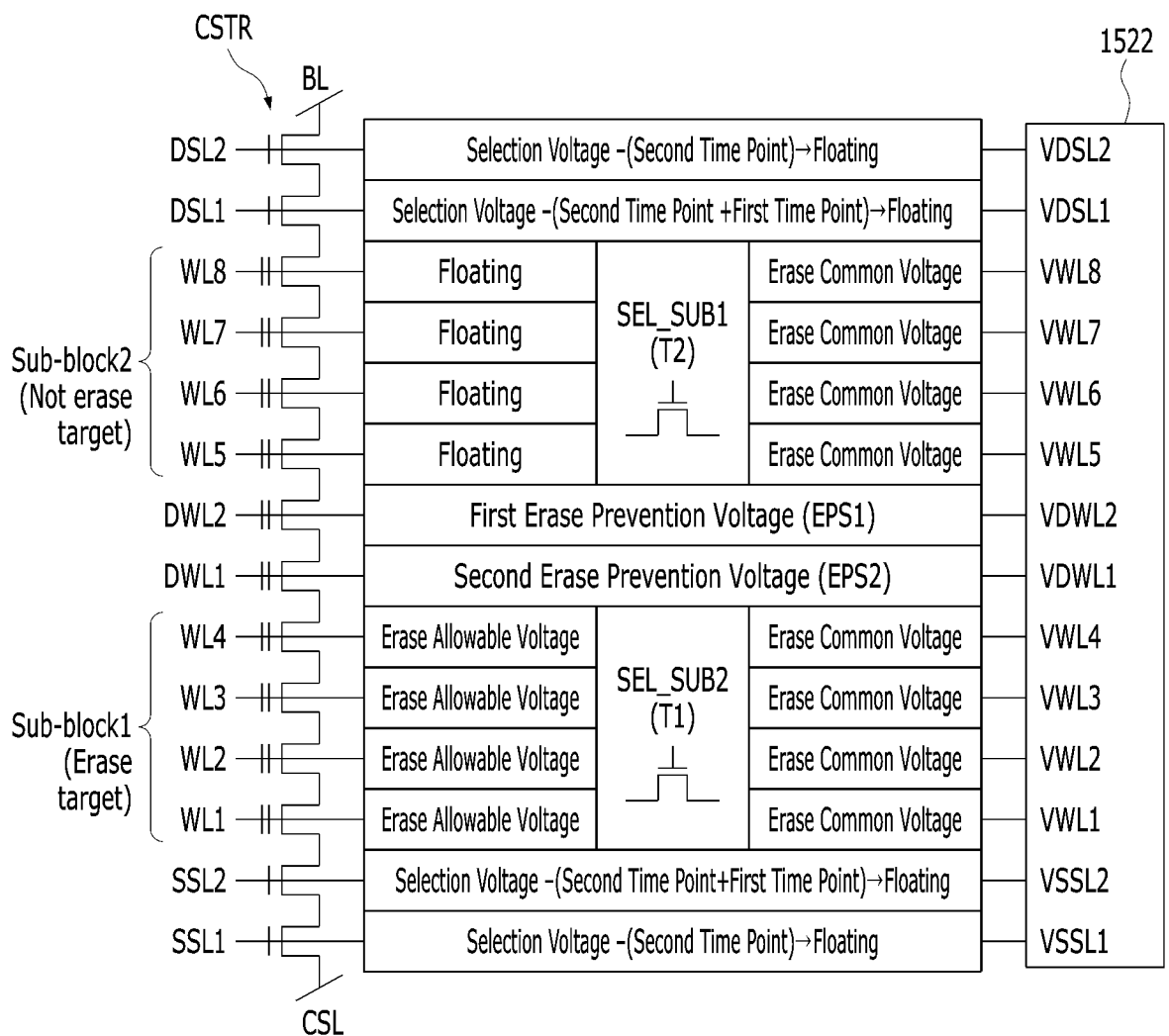

FIG. 4 is a diagram for describing an example of the erase operation performed by the memory device in accordance with an embodiment of the present invention.

Referring to FIGS. 1 to 4, an example of the erase operation performed by the memory device 150 in accordance with an embodiment of the present invention will be described as follows.

First, as described with reference to FIG. 2, the memory device 150 may include the memory cell array 151, the peripheral circuits 152 to 155 and the control logic 156.

The memory cell array 151 may include a plurality of memory cells stacked in a direction crossing the substrate and a plurality of word lines WL<1:8> and DWL<1:2> arranged between two or more source select lines SSL<1:2> and two or more drain select lines DSL<1:2>. The memory cell array 151 may include a plurality of memory blocks BLK1 to BLKn in which two or more word lines located in the middle of the plurality of word lines WL<1:8> are used as dummy word lines DWL<1:2>.

The peripheral circuits 152 to 155 may establish the word lines WL<1:4> stacked on one side of the dummy word lines DWL<1:2>into a first sub-block Sub-block1, and establish the word lines WL<5:8> stacked on the other side thereof into a second sub-block Sub-block2, the dummy word lines DWL<1:2> being located in the middle of the plurality of word lines WL<1:8> and DWL<1:2> included in each of the memory blocks BLK1 to BLKn. At this time, the embodiment in which two or more sub-blocks Sub-block1 and Sub-block2 included in each of the memory blocks BLK1 to BLKn has been already described with reference to FIG. 3.

The peripheral circuits 152 to 155 may perform an erase operation by applying an erase voltage to the substrate of a memory block selected among the plurality of memory blocks BLK1 to BLKn. That is, the peripheral circuits 152 to 155 may perform the erase operation by applying the erase voltage to the common source line CSL of the selected memory block. At this time, in an erase operation period in which the erase voltage is applied to the substrate of the selected memory block, the peripheral circuits 152 to 155 may select any of the first and second sub-blocks Sub-block1 and Sub-block2 included in the selected memory block, and then perform an independent erase operation only on the selected sub-block. For example, when the first sub-block Sub-block1 is selected as an erase target and the second sub-block Sub-block2 is not selected as the erase target, the erase operation may be performed only on the first sub-block Sub-block1, and not be performed on the second sub-block Sub-block2.

For reference, an operation of erasing a memory cell in a program state through a method of raising the potential level of a channel of a selected memory block by applying the erase voltage to the substrate of the selected memory block may be defined as a Gate Induced Drain Leakage (GIDL)-based erase operation. That is, during the GIDL-based erase operation, electrons stored in a charge storage layer of the memory cell in the program state among the plurality of memory cells included in the selected memory block may be de-trapped by the high potential level of the channel and the low potential level of a word line. Thus, the memory cell in the program state may transition to the erase state.

The peripheral circuits 152 to 155 may set the levels of the first and second transfer voltages T1 and T2 to different levels in the erase operation period. The first transfer voltage T1 may be used to control the transfer of the erase common voltage S to the sub-block which is selected as the erase target between the first and second sub-blocks Sub-block1 and Sub-block2 included in the selected memory block, and the second transfer voltage T2 may be used to control the transfer of the erase common voltage S to the sub-block which is not selected as the erase target between the first and second sub-blocks Sub-block1 and Sub-block2 included in the selected memory block. Through this operation, the peripheral circuits 152 to 155 may apply the erase common voltage S as an erase allowable voltage to a word line of the selected sub-block and float a word line of the unselected sub-block. The peripheral circuits 152 to 155 may set the level of the first transfer voltage T1 to be higher by a predetermined level than the level of the erase common voltage S, such that the erase common voltage S is transferred as the erase allowable voltage to the selected sub-block. The peripheral circuits 152 to 155 may set the level of the second transfer voltage T2 to be equal to or lower than the level of the erase common voltage S, in order to float the word line coupled to the unselected sub-block by blocking the erase common voltage S from being transferred to the word line of the unselected sub-block. For example, the erase common voltage S may be set to a ground voltage level VSS or a negative level lower than the ground voltage VSS. Therefore, the erase allowable voltage may have the ground voltage level VSS or the negative level lower than the ground voltage VSS. Furthermore, the level of the first transfer voltage T1 may be set higher than the ground voltage VSS, i.e. a level between 3V and 4.5V. Furthermore, the level of the second transfer voltage T2 may be set to the ground voltage level VSS or a negative level lower than the ground voltage VSS.

The peripheral circuits 152 to 155 may apply the erase prevention voltages to the dummy word lines DWL<1:2> disposed between the word lines WL<1:4> of the first sub-block Sub-block1 and the word lines WL<5:8> of the second sub-block Sub-block2, thereby minimizing the influence of the erase operation for the selected sub-block on the unselected sub-block between the first and second sub-blocks Sub-block1 and Sub-block2. Since the number of the dummy word lines DWL<1:2> is two or more, the peripheral circuits 152 to 155 may apply the erase prevention voltage having a relatively low potential level to the dummy word line of the dummy word lines DWL<1:2>, which is closer to the sub-block selected as the erase target, and apply the erase prevention voltage having a relatively high potential level to the dummy word line of the dummy word lines DWL<1:2>, which is farther from the sub-block selected as the erase target. At this time, the erase prevention voltage may have a potential level higher than the erase allowable voltage and lower than the erase voltage. For example, the peripheral circuits 152 to 155 may apply the erase prevention voltage having a level of 5V to one dummy word line closer to a sub-block selected as the erase target, between the two dummy word lines DWL<1:2>, and the erase prevention voltage having a level of 10V to the other dummy word line farther from the sub-block selected as the erase target.

The peripheral circuits 152 to 155 may float the source select line SSL and the drain select line DSL of the selected memory block in the erase operation period. In the erase operation period, the peripheral circuits 152 to 155 may apply the selection voltage SS to the source select line SSL and float the drain select line DSL at a first time point that the erase voltage starts to be applied to the substrate of the selected memory block, and then float the source select line SSL within a preset time from a second time point later than the first time point. In another embodiment, in the erase operation period, the peripheral circuits 152 to 155 may apply the selection voltage SS to the drain select line DSL and float the source select line SSL at the first time point that the erase voltage starts to be applied to the substrate of the selected memory block, and then float the drain select line DSL within the preset time from the second time point later than the first time point. In another embodiment, in the erase operation period, the peripheral circuits 152 to 155 may apply the selection voltage SS to each of the source select line SSL and the drain select line DSL at the first time point that the erase voltage starts to be applied to the substrate of the selected memory block, and then float the source select line SSL and the drain select line DSL within the preset time from the second time point later than the first time point. At this time, the peripheral circuits 152 to 155 may sequentially float the two or more source select lines SSL from the source select line closer to substrate to the source select line farther from the substrate. Furthermore, the peripheral circuits 152 to 155 may sequentially float the two or more drain select lines DSL from the drain select line farther from the substrate to the drain select line closer to the substrate.

More specifically, the row decoder 152 of the peripheral circuits 152 to 155 may include a block decoder 1521, a line driver 1522, a first select transistor 1523 and a second select transistor 1524.

The block decoder 1521 may decode a block address BLK_ADD, and output a block select signal SEL_BLK, a first sub-select signal SEL_SUB1 and a second sub-select signal SEL_SUB2. At this time, the block address BLK_ADD may be included in the row address RADD (see FIG. 2). For example, the block decoder 1521 may divide the plurality of memory blocks BLK1 to BLKn into a memory block selected as an operation target (read, program or erase target) and unselected memory blocks, in response to the block address BLK_ADD. For example, in the case of the memory block selected as the operation target among the plurality of memory blocks BLK1 to BLKn, the block select signal SEL_BLK may be set to a logic 'high' level. In the case of the memory block which is not selected as the operation target, the block select signal SEL_BLK may be set to a logic 'low' level.

The block decoder 1521 may establish the first and second sub-blocks Sub-block1 and Sub-block2, included in the selected memory block, into the sub-block selected as the erase target and the sub-block which is not selected as the erase target, in response to the block address BLK_ADD. At this time, the block decoder 1521 may set the level of the sub-select signal SEL_SUB1 or SEL_SUB2, corresponding to the sub-block selected as the erase target, to the level of the first transfer voltage T1, and set the level of the sub-select signal SEL_SUB1 or SEL_SUB2, corresponding to the sub-block which is not selected as the erase target, to the level of the second transfer voltage T2. For example, when the first sub-block Sub-block1 is selected as the erase target and the second sub-block Sub-block2 is not selected as the erase target, the block decoder 1521 may set the level of the first sub-select signal SEL_SUB1 to the level of the first transfer voltage T1 and set the level of the second sub-select signal SEL_SUB2 to the level of the second transfer voltage T2.

For reference, when operations (read and program operations) other than the erase operation are performed on the word lines WL<1:8> of the first and second sub-blocks Sub-block1 and Sub-block2, the levels of the sub-select signals SEL_SUB1 and SEL_SUB2 may be set so that a voltage generated by the line driver 1522 drives the word lines WL<1:8> without change of a voltage level.

The first select transistor 1523 may include a plurality of transistors for applying the voltage, generated by the line driver 1522, to the word lines WL<1:4> of the first sub-block Sub-block1 in response to the first sub-select signal SEL_SUB1 generated by the block decoder 1521. For example, when the first sub-select signal SEL_SUB1 is set to the level of the first transfer voltage T1 in the erase operation period, the first select transistor 1523 may output the erase common voltage S, generated by the line driver 1522, as the erase allowable voltage in response to the first transfer voltage T1, thereby driving the word lines WL<1:4> of the first sub-block Sub-block1 to the erase allowable voltage. For another example, when the first sub-select signal SEL_SUB1 is set to the level of the second transfer voltage T2 in the erase operation period, the first select transistor 1523 may block the transfer of the erase common voltage S generated by the line driver 1522 in response to the second transfer voltage T2, thereby floating the word lines WL<1:4> of the first sub-block Sub-block1.

The second select transistor 1524 may include a plurality of transistors for driving the word lines WL<5:8> of the second sub-block Sub-block2 by the voltage, generated by the line driver 1522, in response to the second sub-select signal SEL_SUB2 generated by the block decoder 1521. For example, when the second sub-select signal SEL_SUB2 is set to the level of the first transfer voltage T1 in the erase operation period, the second select transistor 1524 may output the erase common voltage S generated by the line driver 1522 as the erase allowable voltage in response to the first transfer voltage T1, thereby driving the word lines WL<5:8> of the second sub-block Sub-block2 to the erase allowable voltage. For another example, when the second sub-select signal SEL_SUB2 is set to the level of the second transfer voltage T2 in the erase operation period, the second select transistor 1524 may block the transfer of the erase common voltage S generated by the line driver 1522 in response to the second transfer voltage T2, thereby floating the word lines WL<5:8> of the second sub-block Sub-block2.

The line driver 1522 may generate various driving voltages VSSL<1:2>, VWL<1:8>, VDWL<1:2> and VDSL<1:2> for driving the word lines WL<1:8> and DWL<1:2>, the source select lines SSL<1:2> and the drain select lines DSL<1:2> of the selected memory block in response to the block select signal SEL_BLK outputted from the block decoder 1521. At this time, the various driving voltages VSSL<1:2>, VWL<1:8>, VDWL<1:2> and VDSL<1:2> generated by the line driver 1522 may have various levels according to the types of operations (read, program, and erase operations) on the selected memory block.

FIGS. 5 to 8 are diagrams for describing an erase operation method of the memory device in accordance with an embodiment of the present disclosure.

FIGS. 1 to 5 show the case in which the erase operation is performed on the second sub-block Sub-block2 and not performed on the first sub-block Sub-block1, the first and second sub-blocks Sub-block1 and Sub-block2 being included in a memory block selected among the plurality of memory blocks BLK1 to BLKn.

Specifically, the erase voltage may be applied to the substrate of the selected memory block, in order to perform the erase operation on the second sub-block Sub-block2. That is, the erase voltage may be applied to the common source line CSL of the selected memory block, in order to perform the erase operation on the second sub-block Sub-block2.

In the erase operation period in which the erase voltage is applied to the substrate of the selected memory block, the line driver 1522 included in the row decoder 152 may apply the erase common voltage S to the first and second sub-blocks Sub-block1 and Sub-block2. At this time, since the erase operation is not performed on the first sub-block Sub-block1, the block decoder 1521 included in the row decoder 152 may set the level of the first sub-select signal SEL_SUB1 to the level of the second transfer voltage T2. Therefore, the erase common voltage S transferred to the first sub-block Sub-block1 from the line driver 1522 may not be transferred to the word lines WL<1:4> of the first sub-block Sub-block1, and the word lines WL<1:4> of the first sub-block Sub-block1 may be floated. Furthermore, since the erase operation is performed on the second sub-block Sub-block2, the block decoder 1521 included in the row decoder 152 may set the level of the second sub-select signal SEL_SUB2 to the level of the first transfer voltage T1. Therefore, the erase common voltage S transferred to the second sub-block Sub-block2 from the line driver 1522 may be transferred as the erase allowable voltage to the word lines WL<5:8> of the second sub-block Sub-block2.

In the erase operation period in which the erase voltage is applied to the substrate of the selected memory block, the line driver 1522 included in the row decoder 152 may apply the erase prevention voltages EPS1 and EPS2 to the dummy word lines DWL<1:2> located between the word lines WL<1:4> of the first sub-block Sub-block1 and the word lines WL<5:8> of the second sub-block Sub-block2. At this time, since the second sub-block Sub-block2 is the sub-block selected as the erase target and the first sub-block Sub-block1 is the sub-block which is not selected as the erase target, a first erase prevention voltage EPS1 having a relatively low level may be applied to a second dummy word line DWL<2> closer to the second sub-block Sub-block2 between the dummy word lines DWL<1:2>, and a second erase prevention voltage EPS2 having a relatively high level may be applied to a first dummy word line DWL<1> farther from the second sub-block Sub-block2 between the dummy word lines DWL<1:2>.

In the erase operation period in which the erase voltage is applied to the substrate of the selected memory block, the line driver 1522 included in the row decoder 152 may float the drain select lines DSL<1:2> and the source select lines SSL<1:2>.

FIGS. 1 to 4 and 6 show the case in which the erase operation is performed on the second sub-block Sub-block2 and not performed on the first sub-block Sub-block1, the first and second sub-blocks Sub-block1 and Sub-block2 being included in a memory block selected among the plurality of memory blocks BLK1 to BLKn.

Specifically, the erase voltage may be applied to the substrate of the selected memory block, in order to perform the erase operation on the second sub-block Sub-block2. That is, the erase voltage may be applied to the common source line CSL of the selected memory block, in order to perform the erase operation on the second sub-block Sub-block2.

In the erase operation period in which the erase voltage is applied to the substrate of the selected memory block, the line driver 1522 included in the row decoder 152 may apply the erase common voltage S to the first and second sub-blocks Sub-block1 and Sub-block2. At this time, since the erase operation is not performed on the first sub-block Sub-block1, the block decoder 1521 included in the row decoder 152 may set the level of the first sub-select signal SEL_SUB1 to the level of the second transfer voltage T2. Therefore, the erase common voltage S transferred to the first sub-block Sub-block1 from the line driver 1522 may not be transferred to the word lines WL<1:4> of the first sub-block Sub-block1, and the word lines WL<1:4> of the first sub-block Sub-block1 may be floated. Furthermore, since the erase operation is performed on the second sub-block Sub-block2, the block decoder 1521 included in the row decoder 152 may set the level of the second sub-select signal SEL_SUB2 to the level of the first transfer voltage T1. Therefore, the erase common voltage S transferred to the second sub-block Sub-block2 from the line driver 1522 may be applied as the erase allowable voltage to the word lines WL<5:8> of the second sub-block Sub-block2.

In the erase operation period in which the erase voltage is applied to the substrate of the selected memory block, the line driver 1522 included in the row decoder 152 may apply the erase prevention voltages EPS1 and EPS2 to the dummy word lines DWL<1:2> located between the word lines WL<1:4> of the first sub-block Sub-block1 and the word lines WL<5:8> of the second sub-block Sub-block2. At this time, since the second sub-block Sub-block2 is the sub-block selected as the erase target and the first sub-block Sub-block1 is the sub-block which is not selected as the erase target, the first erase prevention voltage EPS1 having a relatively low level may be applied to the second dummy word line DWL<2> closer to the second sub-block Sub-block2 between the dummy word lines DWL<1:2>, and the second erase prevention voltage EPS2 having a relatively high level may be applied to the first dummy word line DWL<1> farther from the second sub-block Sub-block2 between the dummy word lines DWL<1:2>.

In the erase operation period in which the erase voltage is applied to the substrate of the selected memory block, the line driver 1522 included in the row decoder 152 may float the drain select lines DSL<1:2>.

In the erase operation period in which the erase voltage is applied to the substrate of the selected memory block, the line driver 1522 included in the row decoder 152 may apply the selection voltage SS to the source select lines SSL<1:2> at the first time point that the erase voltage starts to be applied to the substrate of the selected memory block during the erase operation period, and float the source select lines SSL<1:2> within a preset time from the second time point later than the first time point. At this time, the line driver 1522 may sequentially float the two or more source select lines SSL<1:2> from the source select line closer to the substrate to the source select line farther from the substrate. For example, the line driver 1522 may apply the selection voltage SS to a first source select line SSL<1> closer to the substrate between the two source select lines SSL<1:2> at the first time point, and float the first source select line SSL<1> at the second time point. On the other hand, the line driver 1522 may apply the selection voltage SS to a second source select line SSL<2> farther from the substrate between the two source select lines SSL<1:2> at the first time point, and float the second source select line SSL<2> at the time point when a first time has elapsed from the second time point.

When the target level of the erase voltage is 20V and the time point at which a preset time has elapsed from the second time point is a third time point, the period between the first and third time points is the period in which the level of the erase voltage rises from 0V to 20V. The period between the second time point and the time point at which the first time has elapsed from the second time point may be the period in which the level of the erase voltage rises by 1V. For example, when the level of the erase voltage is 8V at the second time point, the level of the erase voltage may be 9V, and the erase voltage may rise to the target level of 20V, at the time point at which the first time has elapsed from the second time point. Furthermore, the time point at which the first time has elapsed from the second time point may be earlier than the third time point.

FIGS. 1 to 4 and 7 show the case in which the erase operation is performed on the first sub-block Sub-block1 and not performed on the second sub-block Sub-block2, the first and second sub-blocks Sub-block1 and Sub-block2 being included in a memory block selected among the plurality of memory blocks BLK1 to BLKn.

Specifically, the erase voltage may be applied to the substrate of the selected memory block, in order to perform the erase operation on the first sub-block Sub-block1. That is, the erase voltage may be applied to the common source line CSL of the selected memory block, in order to perform the erase operation on the first sub-block Sub-block1.

In the erase operation period in which the erase voltage is applied to the substrate of the selected memory block, the line driver 1522 included in the row decoder 152 may apply the erase common voltage S to the first and second sub-blocks Sub-block1 and Sub-block2. At this time, since the erase operation is not performed on the second sub-block Sub-block2, the block decoder 1521 included in the row decoder 152 may set the level of the second sub-select signal SEL_SUB2 to the level of the second transfer voltage T2. Therefore, the erase common voltage S transferred to the second sub-block Sub-block2 from the line driver 1522 may not be transferred to the word lines WL<5:8> of the second sub-block Sub-block2, and the word lines WL<5:8> of the second sub-block Sub-block2 may be floated. Furthermore, since the erase operation is performed on the first sub-block Sub-block1, the block decoder 1521 included in the row decoder 152 may set the level of the first sub-select signal SEL_SUB1 to the level of the first transfer voltage T1. Therefore, the erase common voltage S transferred to the first sub-block Sub-block1 from the line driver 1522 may be transferred as the erase allowable voltage to the word lines WL<1:4> of the first sub-block Sub-block1.

In the erase operation period in which the erase voltage is applied to the substrate of the selected memory block, the line driver 1522 included in the row decoder 152 may apply the erase prevention voltages EPS1 and EPS2 to the dummy word lines DWL<1:2> located between the word lines WL<1:4> of the first sub-block Sub-block1 and the word lines WL<5:8> of the second sub-block Sub-block2. At this time, since the first sub-block Sub-block1 is the sub-block selected as the erase target and the second sub-block Sub-block2 is the sub-block which is not selected as the erase target, the first erase prevention voltage EPS1 having a relatively low level may be applied to the first dummy word line DWL<1> closer to the first sub-block Sub-block1 between the dummy word lines DWL<1:2>, and the second erase prevention voltage EPS2 having a relatively high level may be applied to the second dummy word line DWL<2> farther from the first sub-block Sub-block1 between the dummy word lines DWL<1:2>.

In the erase operation period in which the erase voltage is applied to the substrate of the selected memory block, the line driver 1522 included in the row decoder 152 may float the source select lines SSL<1:2>.

In the erase operation period in which the erase voltage is applied to the substrate of the selected memory block, the line driver 1522 included in the row decoder 152 may apply the selection voltage SS to the drain select lines DSL<1:2> at the first time point that the erase voltage starts to be applied to the substrate of the selected memory block during the erase operation period, and float the drain select lines DSL<1:2> within a preset time from the second time point later than the first time point. At this time, the line driver 1522 may sequentially float the two or more drain select lines DSL<1:2> from the drain select line farther from the substrate to the drain select line closer to the substrate. For example, the line driver 1522 may apply the selection voltage SS to a second drain select line DSL<2> farther from the substrate between the two drain select lines DSL<1:2> at the first time point, and float the second drain select line DSL<2> at the second time point. On the other hand, the line driver 1522 may apply the selection voltage SS to a first drain select line DSL<1> closer to the substrate between the two drain select lines DSL<1:2> at the first time point, and float the first drain select line DSL<1> at the time point when the first time has elapsed from the second time point.

When the target level of the erase voltage is 20V and the time point at which a preset time has elapsed from the second time point is a third time point, the period between the first and third time points is the period in which the level of the erase voltage rises from 0V to 20V. The period between the second time point and the time point at which the first time has elapsed from the second time point may be the period in which the level of the erase voltage rises by 1V. For example, when the level of the erase voltage is 8V at the second time point, the level of the erase voltage may be 9V, and the erase voltage may rise to the target level of 20V, at the time point that the first time has elapsed from the second time point. Furthermore, the time point that the first time has elapsed from the second time point may be earlier than the third time point.

FIGS. 1 to 4 and 8 show the case in which the erase operation is performed on the first sub-block Sub-block1 and not performed on the second sub-block Sub-block2, the first and second sub-blocks Sub-block1 and Sub-block2 being included in a memory block selected among the plurality of memory blocks BLK1 to BLKn.

Specifically, the erase voltage may be applied to the substrate of the selected memory block, in order to perform the erase operation on the first sub-block Sub-block1. That is, the erase voltage may be applied to the common source line CSL of the selected memory block, in order to perform the erase operation on the first sub-block Sub-block1.

In the erase operation period in which the erase voltage is applied to the substrate of the selected memory block, the line driver 1522 included in the row decoder 152 may apply the erase common voltage S to the first and second sub-blocks Sub-block1 and Sub-block2. At this time, since the erase operation is not performed on the second sub-block Sub-block2, the block decoder 1521 included in the row decoder 152 may set the level of the second sub-select signal SEL_SUB2 to the level of the second transfer voltage T2. Therefore, the erase common voltage S transferred to the second sub-block Sub-block2 from the line driver 1522 may not be transferred to the word lines WL<5:8> of the second sub-block Sub-block2, and the word lines WL<5:8> of the second sub-block Sub-block2 may be floated. Furthermore, since the erase operation is performed on the first sub-block Sub-block1, the block decoder 1521 included in the row decoder 152 may set the level of the first sub-select signal SEL_SUB1 to the level of the first transfer voltage T1. Therefore, the erase common voltage S transferred to the first sub-block Sub-block1 from the line driver 1522 may be transferred as the erase allowable voltage to the word lines WL<1:4> of the first sub-block Sub-block1.

In the erase operation period in which the erase voltage is applied to the substrate of the selected memory block, the line driver 1522 included in the row decoder 152 may apply the erase prevention voltages EPS1 and EPS2 to the dummy word lines DWL<1:2> located between the word lines WL<1:4> of the first sub-block Sub-block1 and the word lines WL<5:8> of the second sub-block Sub-block2. At this time, since the first sub-block Sub-block1 is the sub-block selected as the erase target and the second sub-block Sub-block2 is the sub-block which is not selected as the erase target, the first erase prevention voltage EPS1 having a relatively low level may be applied to the first dummy word line DWL<1> closer to the first sub-block Sub-block1 between the dummy word lines DWL<1:2>, and the second erase prevention voltage EPS2 having a relatively high level may be applied to the second dummy word line DWL<2> farther from the first sub-block Sub-block1 between the dummy word lines DWL<1:2>.

In the erase operation period in which the erase voltage is applied to the substrate of the selected memory block, the line driver 1522 included in the row decoder 152 may apply the selection voltage SS to the source select lines SSL<1:2> at the first time point that the erase voltage starts to be applied to the substrate of the selected memory block during the erase operation period, and float the source select lines SSL<1:2> within a preset time from the second time point later than the first time point. At this time, the line driver 1522 may sequentially float the two or more source select lines SSL<1:2> from the source select line closer to the substrate to the source select line farther from the substrate. For example, the line driver 1522 may apply the selection voltage SS to the first source select line SSL<1> closer to the substrate between the two source select lines SSL<1:2> at the first time point, and float the first source select line SSL<1> at the second time point. On the other hand, the line driver 1522 may apply the selection voltage SS to the second source select line SSL<2> farther from the substrate between the two source select lines SSL<1:2> at the first time point, and float the second source select line SSL<2> at the time point that the first time has elapsed from the second time point.

In the erase operation period in which the erase voltage is applied to the substrate of the selected memory block, the line driver 1522 included in the row decoder 152 may apply the selection voltage SS to the drain select lines DSL<1:2> at the first time point that the erase voltage starts to be applied to the substrate of the selected memory block during the erase operation period, and float the drain select lines DSL<1:2> within a preset time from the second time point later than the first time point. At this time, the line driver 1522 may sequentially float the two or more drain select lines DSL<1:2> from the drain select line farther from the substrate to the drain select line closer to the substrate. For example, the line driver 1522 may apply the selection voltage SS to the second drain select line DSL<2> farther from the substrate between the two drain select lines DSL<1:2> at the first time point, and float the second drain select line DSL<2> at the second time point. On the other hand, the line driver 1522 may apply the selection voltage SS to the first drain select line DSL<1> closer to the substrate between the two drain select lines DSL<1:2> at the first time point, and float the first drain select line DSL<1> at the time point that the first time has elapsed from the second time point.

When the target level of the erase voltage is 20V and the time point that a preset time has elapsed from the second time point is a third time point, the period between the first and third time points is the period in which the level of the erase voltage rises from 0V to 20V. The period between the second time point and the time point at which the first time has elapsed from the second time point may be the period in which the level of the erase voltage rises by 1V. For example, when the level of the erase voltage is 8V at the second time point, the level of the erase voltage may be 9V, and the erase voltage may rise to the target level of 20V, at the time point that the first time has elapsed from the second time point. Furthermore, the time point that the first time has elapsed from the second time point may be earlier than the third time point.

Although various embodiments have been described for illustrative purposes, it will be apparent to those skilled in the art that various changes and modifications may be made without departing from the spirit and scope of the invention as defined in the following claims. Furthermore, the embodiments disclosed may be combined to form additional embodiments.

What is claimed is:

1. A memory device comprising:
a memory block including a plurality of memory cells stacked in a direction crossing a substrate, and a plurality of word lines arranged between two or more source select lines and two or more drain select lines, wherein two or more word lines located in the middle of the plurality of word lines are used as dummy word lines;
a control circuit suitable for:
establishing word lines, stacked on one side of the dummy word lines among the plurality of word lines into a first sub-block,
establishing word lines, stacked on the other side of the dummy word lines into a second sub-block,
selecting one of the first and second sub-blocks in an erase operation period in which an erase voltage is applied to the substrate, and
performing the independent erase operation only on the selected sub-block; and
a control logic suitable for controlling the control circuit to differently set a level of a first transfer voltage for controlling transfer of an erase common voltage to the selected sub-block and a level of a second transfer voltage for controlling transfer of the erase common voltage to the unselected sub-block, to apply the erase common voltage as an erase allowable voltage to a word line of the selected sub-block, and to float a word line of the unselected sub-block, in the erase operation period.

2. The memory device of claim 1, wherein in the erase operation period, the control logic further controls the control circuit to set the level of the first transfer voltage to be higher by a predetermined level than a level of the erase common voltage thereby applying the erase common voltage as the erase allowable voltage.

3. The memory device of claim 2, wherein in the erase operation period, the control logic further controls the control circuit to set the level of the second transfer voltage to be equal to or lower than the level of the erase common voltage thereby floating the word line of the unselected sub-block by blocking the erase common voltage from being transferred to the unselected sub-block.

4. The memory device of claim 1, wherein the control logic further controls, during the erase operation period, the control circuit to:
 float the drain select lines and apply a selection voltage to the source select lines at a first time point that the erase voltage starts to be applied to the substrate, and
 sequentially float the two or more source select lines from the source select line closer to the substrate to the source select line farther from the substrate within a preset time from a second time point later than the first time point.

5. The memory device of claim 1, wherein the control logic further controls, during the erase operation period, the control circuit to:
 float the source select lines and apply a selection voltage to the drain select lines at a first time point that the erase voltage starts to be applied to the substrate, and
 sequentially float the two or more drain select lines from the drain select line farther from the substrate to the drain select line closer to the substrate within a preset time from a second time point later than the first time point.

6. The memory device of claim 1, wherein the control logic further controls, during the erase operation period, the control circuit to:
 apply a selection voltage to the source select lines and the drain select lines at a first time point that the erase voltage starts to be applied to the substrate, and
 sequentially float the two or more drain select lines from the drain select line farther from the substrate to the drain select line closer to the substrate and sequentially float the two or more source select lines from the source select line closer to the substrate to the source select line farther from the substrate, within a preset time from a second time point later than the first time point.

7. The memory device of claim 1,
 wherein in the erase operation period, the control logic further controls the control circuit to apply an erase prevention voltage having a relatively low potential level to a dummy word line closer to the selected sub-block and to apply the erase prevention voltage having a relatively high potential level to a dummy word line farther from the selected sub-block, among the two or more dummy word lines located between the selected sub-block and the unselected sub-block,
 wherein the erase prevention voltage has a potential level higher than the erase allowable voltage and lower than the erase voltage.

8. The memory device of claim 1, wherein the control circuit comprises:
 a voltage generator suitable for generating the erase voltage, the erase common voltage, the first transfer voltage and the second transfer voltage;
 a page buffer coupled to a bit line of the memory block, and suitable for controlling the bit line to be floated in the erase operation period; and
 a row decoder suitable for driving the word line of the selected sub-block to the erase allowable voltage in response to the first transfer voltage and floating the word line of the unselected sub-block in response to the second transfer voltage.

9. A memory device comprising:
 a memory block including a plurality of memory cells stacked in a direction crossing a substrate, and a plurality of word lines arranged between two or more source select lines and two or more drain select lines, wherein two or more word lines located in the middle of the plurality of word lines are used as dummy word lines; and
 a control circuit suitable for:
 establishing word lines, stacked on one side of the dummy word lines among the plurality of word lines into a first sub-block,
 establishing word lines, stacked on the other side of the dummy word lines into a second sub-block,
 selecting one of the first and second sub-blocks in an erase operation period in which an erase voltage is applied to the substrate, and
 performing the independent erase operation only on the selected sub-block,
 wherein in the erase operation period, the control circuit is further suitable for:
 differently setting a level of a first transfer voltage for controlling transfer of an erase common voltage to the selected sub-block and a level of a second transfer voltage for controlling transfer of the erase common voltage to the unselected sub-block,
 applying the erase common voltage as an erase allowable voltage to a word line of the selected sub-block and floating a word line of the unselected sub-block.

10. The memory device of claim 9, wherein in the erase operation period, the control circuit sets the level of the first transfer voltage to be higher by a predetermined level than a level of the erase common voltage thereby applying the erase common voltage as the erase allowable voltage.

11. The memory device of claim 10, wherein in the erase operation period, the control circuit sets the level of the second transfer voltage to be equal to or lower than the level of the erase common voltage thereby floating the word line of the unselected sub-block by blocking the erase common voltage from being transferred to the unselected sub-block.

12. The memory device of claim 9, wherein the control circuit is further suitable for, during the erase operation period:
 floating the drain select lines and applying a selection voltage to the source select lines at a first time point that the erase voltage starts to be applied to the substrate, and
 sequentially floating the two or more source select lines from the source select line closer to the substrate to the source select line farther from the substrate within a preset time from a second time point later than the first time point.

13. The memory device of claim 9, wherein the control circuit is further suitable for, during the erase operation period:
 floating the source select lines and applying a selection voltage to the drain select lines at a first time point that the erase voltage starts to be applied to the substrate, and
 sequentially floating the two or more drain select lines from the drain select line farther from the substrate to the drain select line closer to the substrate within a preset time from a second time point later than the first time point.

14. The memory device of claim 9, wherein the control circuit is further suitable for, during the erase operation period:

applying a selection voltage to the source select lines and the drain select lines at a first time point that the erase voltage starts to be applied to the substrate, and sequentially floating the two or more drain select lines from the drain select line farther from the substrate to the drain select line closer to the substrate and sequentially floating the two or more source select lines from the source select line closer to the substrate to the source select line farther from the substrate, within a preset time from a second time point later than the first time point.

15. The memory device of claim 9, wherein in the erase operation period, the control circuit is further suitable for applying an erase prevention voltage having a relatively low potential level to a dummy word line closer to the selected sub-block and applying the erase prevention voltage having a relatively high potential level to a dummy word line farther from the selected sub-block, among the two or more dummy word lines located between the selected sub-block and the unselected sub-block, wherein the erase prevention voltage has a potential level higher than the erase allowable voltage and lower than the erase voltage.

16. An operating method of a memory device which includes a memory block including a plurality of memory cells stacked in a direction crossing a substrate and a plurality of word lines arranged between two or more source select lines and two or more drain select lines, wherein two or more word lines located in the middle of the plurality of word lines are used as dummy word lines, whereinword lines stacked on one side of the dummy word lines among the plurality of word lines are established into a first sub-block, and word lines stacked on the other side of the dummy word lines are established into a second sub-block, the operating method comprising:

an erase operation which includes selecting one of the first and second sub-blocks and then performing the independent erase operation only on the selected sub-block, in an erase operation period in which an erase voltage is applied to the substrate; and a transfer operation which includes:

differently setting a level of a first transfer voltage for controlling transfer of an erase common voltage to the sub-block selected between the first and second sub-blocks and a level of a second transfer voltage for controlling transfer of the erase common voltage to the unselected sub-block, applying the erase common voltage as an erase allowable voltage to a word line of the selected sub-block, and floating a word line of the unselected sub-block, in the erase operation period.

17. The operating method of claim 16, wherein in the erase operation period, the transfer operation further includes:

setting the level of the first transfer voltage to be higher by a predetermined level than a level of the erase common voltage thereby applying the erase common voltage as the erase allowable voltage; and setting the level of the second transfer voltage to a level equal to or lower than the erase common voltage thereby floating the word line of the unselected sub-block by blocking the erase common voltage from being transferred to the unselected sub-block.

18. The operating method of claim 16, further comprising, during the erase operation period, one of:

floating the drain select lines and applying a selection voltage to the source select lines at a first time point that the erase voltage starts to be applied to the substrate, and sequentially floating the two or more source select lines from the source select line closer to the substrate to the source select line farther from the substrate within a preset time from a second time point later than the first time point;

floating the source select lines and applying the selection voltage to the drain select lines at the first time point that the erase voltage starts to be applied to the substrate, and sequentially floating the two or more drain select lines from the drain select line farther from the substrate to the drain select line closer to the substrate within the preset time from the second time point later than the first time point; and applying the selection voltage to the source select lines and the drain select lines at the first time point that the erase voltage starts to be applied to the substrate, and sequentially floating the two or more drain select lines from the drain select line farther from the substrate to the drain select line closer to the substrate, and sequentially floating the two or more source select lines from the source select line closer to the substrate to the source select line farther from the substrate, within the preset time from the second time point later than the first time point.

19. The operating method of claim 16, further comprising, in the erase operation period, applying an erase prevention voltage having a relatively low potential level to a dummy word line closer to the selected sub-block and applying the erase prevention voltage having a relatively high potential level to a dummy word line farther from the selected sub-block, among the two or more dummy word lines located between the selected sub-block and the unselected sub-block, wherein the erase prevention voltage has a potential level higher than the erase allowable voltage and lower than the erase voltage.

* * * * *